(12) United States Patent
Wittmaier

(10) Patent No.: US 6,543,130 B1
(45) Date of Patent: Apr. 8, 2003

(54) ROTATIVE CUTTING METHOD AND DEVICE FOR PRINTED CIRCUIT BOARDS AND ELECTRIC CONDUCTORS

(75) Inventor: Klaus Wittmaier, Vaihingen (DE)

(73) Assignee: Schober GmbH, Eberdingen (DE)

( * ) Notice: Subject to any disclaimer, the term of this patent is extended or adjusted under 35 U.S.C. 154(b) by 0 days.

(21) Appl. No.: 09/600,946

(22) PCT Filed: Jan. 15, 1999

(86) PCT No.: PCT/EP99/00201

§ 371 (c)(1),
(2), (4) Date: Sep. 20, 2000

(87) PCT Pub. No.: WO99/38367

PCT Pub. Date: Jul. 29, 1999

(30) Foreign Application Priority Data

Jan. 24, 1998 (DE) .................................. 198 02 512

(51) Int. Cl.⁷ ................................................ H05K 3/02
(52) U.S. Cl. ................... 29/846; 29/825; 29/832; 29/852; 29/564.1; 29/564.3; 29/412; 156/233; 156/261
(58) Field of Search .................... 29/825, 832, 846, 29/852, 739, 564, 564.1, 564.3, 412, 416, 559, DIG. 37; 156/233, 261, 516

(56) References Cited

U.S. PATENT DOCUMENTS

| | | | | |
|---|---|---|---|---|
| 2,033,553 A | * | 3/1936 | Scholl | 154/2 |
| 2,969,300 A | * | 1/1961 | Franz | 154/96 |
| 3,240,647 A | * | 3/1966 | Morgan | 156/249 |
| 3,473,218 A | | 10/1969 | Travis | 29/624 |
| 3,547,724 A | | 12/1970 | Zagusta | 156/233 |
| 3,713,944 A | | 1/1973 | Dennis et al. | 156/261 |
| 5,184,111 A | * | 2/1993 | Pichl | 29/595 |
| 5,391,249 A | * | 2/1995 | Senft | 156/248 |
| 5,700,340 A | * | 12/1997 | Johnson et al. | 156/152 |
| 5,776,283 A | * | 7/1998 | Kato | 156/249 |
| 5,948,199 A | * | 9/1999 | McGrew | 156/231 |
| 6,076,257 A | * | 6/2000 | Case et al. | 29/846 |
| 6,136,121 A | * | 10/2000 | Jones | 156/94 |
| 6,334,248 B1 | * | 1/2002 | Gallagher | 29/846 |

FOREIGN PATENT DOCUMENTS

| | | |
|---|---|---|
| DE | 2201680 | 7/1973 |
| GB | 1135982 | 12/1968 |

* cited by examiner

*Primary Examiner*—Timothy V. Eley
*Assistant Examiner*—David T. Nguyen
(74) *Attorney, Agent, or Firm*—Young & Basile, P.C.

(57) ABSTRACT

The invention relates to a method and device for producing printed circuit boards and electric conductors. The inventive device comprises a station where a conductive layer is fixed to a support material, a cutting station, connected to the first station so that the conductive layer can be cut to form a conductor and a station where cuttings are removed.

6 Claims, 2 Drawing Sheets

ROTATIVE CUTTING METHOD AND DEVICE FOR PRINTED CIRCUIT BOARDS AND ELECTRIC CONDUCTORS

BACKGROUND OF THE INVENTION

The invention pertains to a rotative cutting method and device for printed-circuit boards and electric conductors.

Figure 1:
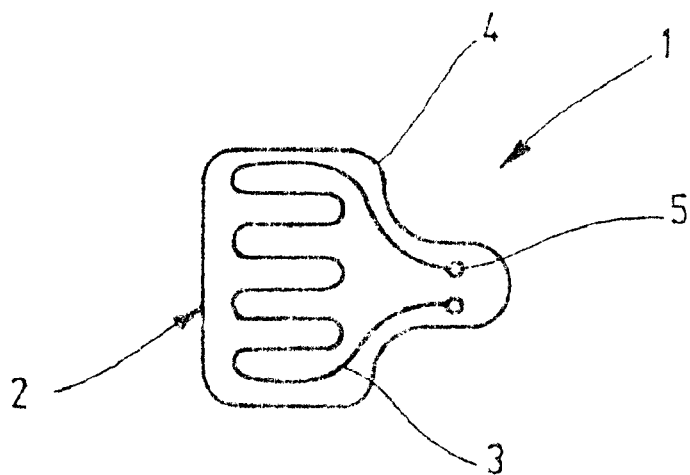

The products 1 shown in FIG. 1 consist of flexible conductors or printed-circuit boards which are manufactured with a multilayered structure and have any desired outside contour 2.

The conductive layer 3 that is applied to the substrate material 4 and that usually consists of a conductive sheet may be of any desired form, where the length of the conductive path is also arbitrary. In addition, the product 1 contains terminal points 5, for example, in the form of holes.

Figure 2:
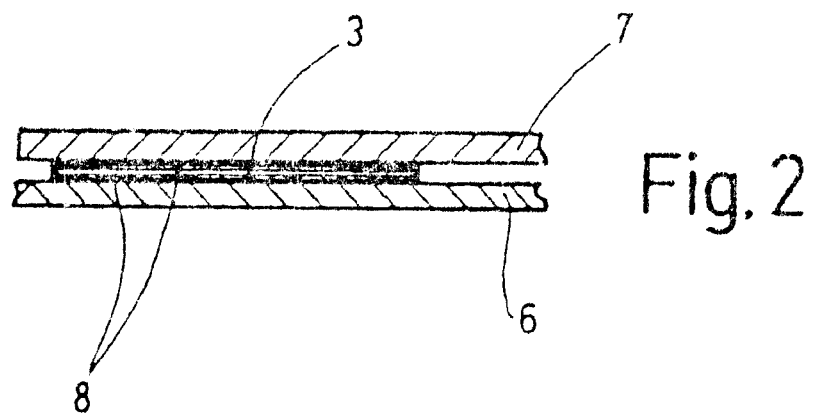

The conductive layer 3 may be positioned between a lower layer 6 and an upper or cover layer 7. The adhesive 8 shown in FIG. 2, for example, is arranged between the layers 3 and 7.

Until now, these products 1 were manufactured by means of galvanic methods, i.e., the portions of the conductive sheet 3 which are not required are etched away such that the desired form remains. This manufacturing method is complicated and is not environmentally friendly.

A second method for manufacturing the products 1 is carried out with a flat knife. In this method, the contours are drawn onto the conductive sheet with a scoring knife and the portions that are not required are pulled off. This method is also very time-consuming and costly.

Both of the aforementioned methods have the disadvantage that sheets of material are predominantly processed and no continuous processing is possible.

Consequently, the present invention is based on the objective of developing a simpler and less expensive method and/or device for manufacturing products of this type that are more environmentally friendly.

DESCRIPTION OF THE PREFERRED EMBODIMENTS

Figure 4:
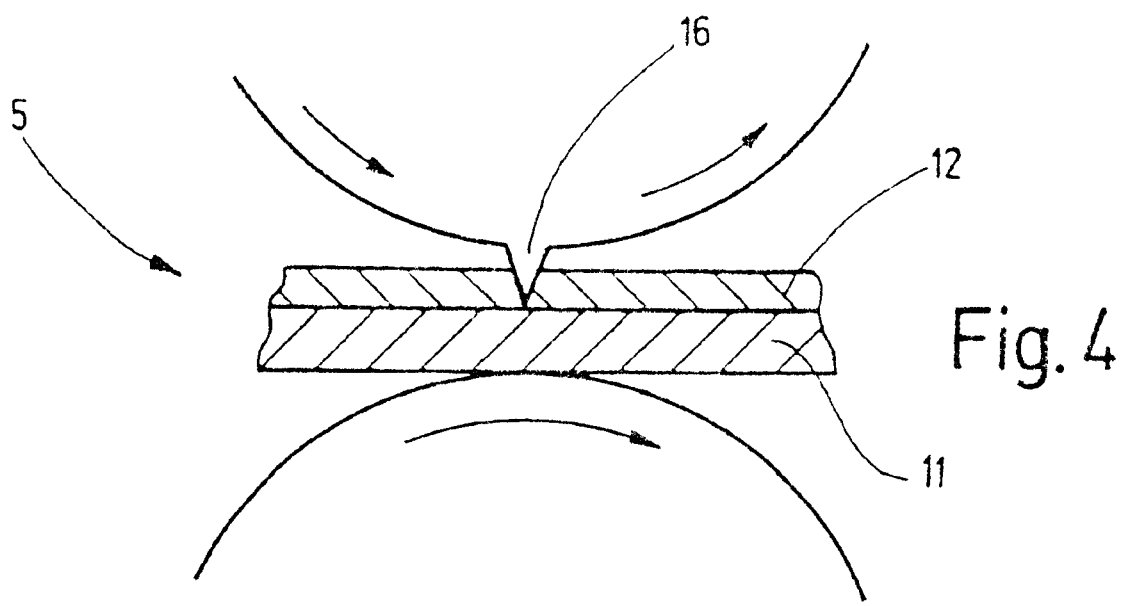
Figure 3:
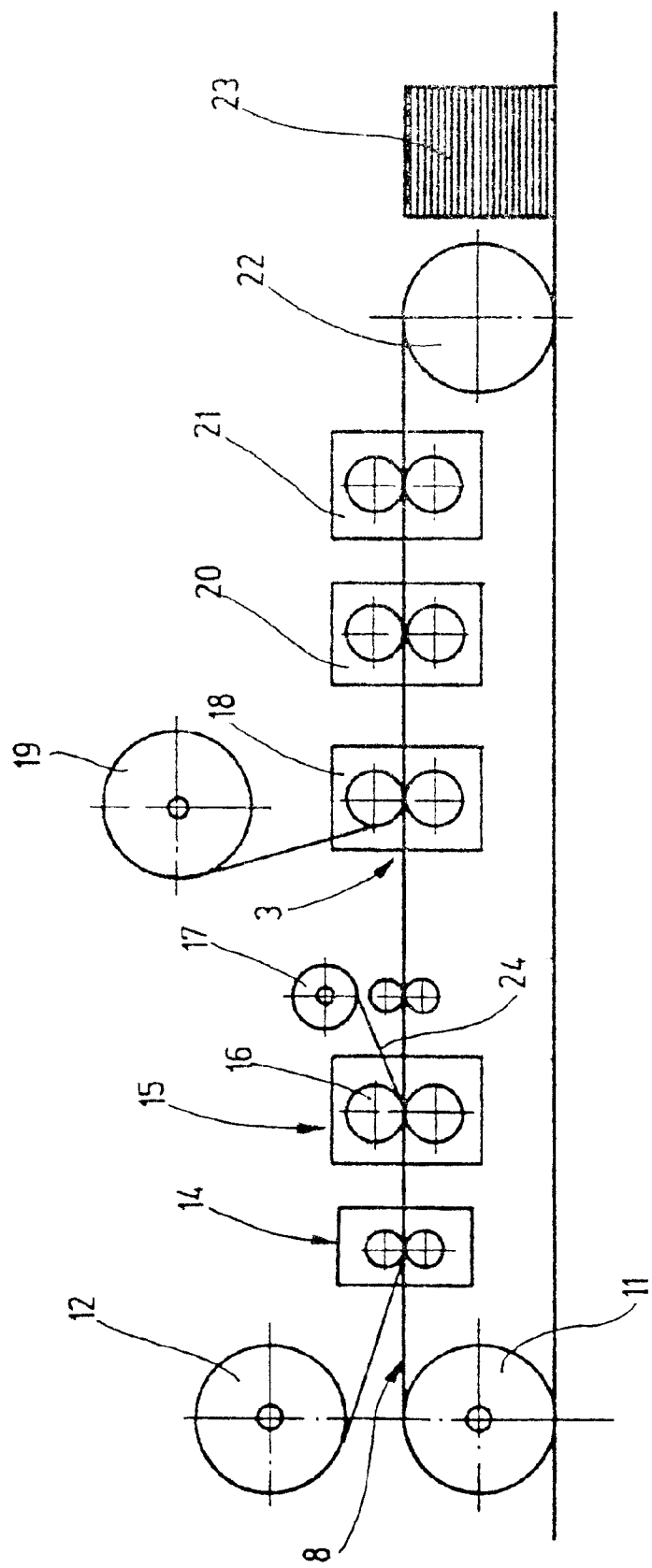

In the method according to the invention, as shown in FIGS. 3 and 4, a conductive sheet or layer 12 is applied to a base or substrate material 11 with or without an adhesive 8. If an adhesive 8 is required, it can be applied with a suitable device, e.g., a spray nozzle, a roller or the like. The base material 11 may already be provided with the adhesive 8 and is unwound from a roll. The sheet 12 and the base material 11 are transported to a laminating station 14, behind which is arranged a cutting station 15. A rotating knife 16 that usually consists of a cutting cylinder and may have any arbitrary shape for the given conductive traces 3 to be manufactured is arranged in this cutting station 15. The conductive layer 12 that was applied to the substrate material 11 and consists of copper or aluminum, for example, is cut through to the required shape by the rotating knife 16, with the substrate material 11 only being cut slightly or not at all.

The contours produced by the knife 16 correspond to that of the required conductive traces 3. The remainder of the material remains on the base material 11 as cuttings 24 that are subsequently removed or, if it consists of a continuous waste pattern, it can be pulled off immediately after the cutting process in a station 17.

With products that contain cover layers 7, the waste is removed in each case. When processing continuous contours, this can be realized by pulling off and rewinding the waste onto a roller at a station 17 or in the form of a special vacuum-assisted waste removal station. The base material 11 with the conductive traces 3 is then passed through a smoothing device to press the cut edges. The cover layer 7 is unwound from a roll 19 and laminated onto the conductive traces 3 in a laminating station 18. Subsequently, the desired number of holes (of any desired shape) are produced in the material sheet by rotating punching tools 20, whereafter the entire product is cut to the desired final shape by a rotating knife 21. If individual elements are produced, they are transferred to an individual output station 23 behind the cutting station 15. If a continuous product is produced, it is continually wound onto a roller 22.

According to one variant of the invention, the conductive layer 12 is fixed on the substrate material 11, e.g., plastic film, by means of ultrasound. In another variation, the substrate material 11 is lacquered such that it can be hot-sealed, with only the part of the applied conductive layer 12 that corresponds to the conductive traces being fixed. The part that is not fixed is cut out and removed in the station 17 as waste. It would also be conceivable to print the substrate material 11 with a conductive paint or liquid that contains copper or aluminum.

FIG. 4 shows a section of the cutting station 15 in the form of an enlarged representation. The knife 16 can be seen which only cuts through the conductive layer 12, and not the substrate material 11.

The advantages of this device are:
 a) the manufacturing process can be carried out from raw product to finished product on an in-line machine;
 b) the rotating cutting knives 16 and 21 allow a significantly higher operating speed than that of conventional methods;
 c) instead of using rotating cutting knives 16 and 21, it would also be possible to arrange a cutting blade on a carrying cylinder;
 d) the method replaces the etching method which negatively impacts the environment; and
 e) the conductive raw materials (copper, aluminum, etc.) can be directly reused in the form of recycled material.

What is claimed is:

1. A method for manufacturing printed-circuit boards and electric conductors comprising the steps of:
 applying a conductive layer to a substrate material;
 cutting the conductive layer by means of a rotative cutting process carried out with a rotating knife;
 pulling cuttings of an unwanted portion of the conductive layer off the substrate material;
 laminating a cover layer onto a wanted portion of the conductive layer still applied to the substrate material in a continuous process;
 producing apertures in the material sheet by means of rotating punching tools; and
 cutting the material sheet to the desired final shape by means of rotating knives.

2. The method according to claim 1 wherein the step of applying the conductive layer to the substrate material is carried out by means of ultrasound.

3. A device for manufacturing printed-circuit boards and electric conductors comprising:
 a station in which a conductive layer is fixed to a substrate material;

a subsequent cutting station for cutting the conductive layer into conductive traces and cuttings;

a station for removing the cuttings;

a laminating station for laminating a cover layer onto the substrate material that contains the conductive traces by a rotating punching tool producing apertures in the material sheet; and a rotating knife for producing the desired final shape.

4. A device according to claim 3 wherein the station for fixing the conductive layer to the substrate material comprises a laminating station.

5. A device according to claim 3, wherein the station in which the conductive layer is fixed to the substrate material comprises an ultrasonic device for fixing at least portions of the conductive layer to the substrate material.

6. A device according to claim 3, wherein the station in which the conductive layer is fixed to the substrate material further comprises a printing station for applying the conductive layer to the substrate material in the form of one of a liquid and a pasty material.

* * * * *